United States Patent
Jenkinson et al.

(10) Patent No.: US 11,200,942 B2
(45) Date of Patent: Dec. 14, 2021

(54) APPARATUSES AND METHODS FOR LOSSY ROW ACCESS COUNTING

(71) Applicant: MICRON TECHNOLOGY, INC., Boise, ID (US)

(72) Inventors: Matthew D. Jenkinson, Boise, ID (US); Jiyun Li, Boise, ID (US); Dennis G. Montierth, Meridian, ID (US); Nathaniel J. Meier, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/549,942

(22) Filed: Aug. 23, 2019

(65) Prior Publication Data

US 2021/0057013 A1     Feb. 25, 2021

(51) Int. Cl.
| | | |
|---|---|---|
| *G11C 11/408* | (2006.01) | |
| *G11C 8/16* | (2006.01) | |
| *H03K 3/03* | (2006.01) | |
| *G06F 12/0802* | (2016.01) | |

(52) U.S. Cl.
CPC ........ *G11C 11/408* (2013.01); *G06F 12/0802* (2013.01); *G11C 8/16* (2013.01); *H03K 3/0315* (2013.01)

(58) Field of Classification Search
CPC ...... G11C 11/408; G11C 8/16; H03K 3/0315; G06F 12/0802
USPC .................................................. 365/230.06
See application file for complete search history.

(56) References Cited

U.S. PATENT DOCUMENTS

| | | |
|---|---|---|
| 1,158,364 A | 10/1915 | Bibb |
| 5,291,198 A | 3/1994 | Dingwall et al. |
| 5,299,159 A | 3/1994 | Balistreri et al. |
| 5,422,850 A | 6/1995 | Sukegawa et al. |
| 5,638,317 A | 6/1997 | Tran |
| 5,699,297 A | 12/1997 | Yamazaki et al. |
| 5,768,196 A | 6/1998 | Bloker et al. |
| 5,933,377 A | 8/1999 | Hidaka |
| 5,943,283 A | 8/1999 | Wong et al. |
| 5,970,507 A | 10/1999 | Kato et al. |

(Continued)

FOREIGN PATENT DOCUMENTS

| | | |
|---|---|---|
| CN | 1195173 A | 10/1998 |
| CN | 101038785 A | 9/2007 |

(Continued)

OTHER PUBLICATIONS

U.S. Appl. No. 16/012,679, titled "Apparatuses and Methods for Multiple Row Hammer Refresh Address Sequences", filed Jun. 19, 2018.

(Continued)

*Primary Examiner* — Fernando Hidalgo
(74) *Attorney, Agent, or Firm* — Dorsey & Whitney LLP

(57) ABSTRACT

Embodiments of the disclosure are drawn to apparatuses, systems, and methods for lossy row access counting. Row addresses along a to address bus may be sampled. When the row address is sampled it may be compared to a plurality of stored addresses in a data storage unit. If the sampled address matches one of the stored addresses, a count value associated with that address may be updated in a first direction (such as being increased). Periodically, all of the count values may also be updated in a second direction (for example, decreased).

16 Claims, 8 Drawing Sheets

(56) References Cited

U.S. PATENT DOCUMENTS

| | | |
|---|---|---|
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,212,118 B1 | 4/2001 | Fujita |
| 6,310,806 B1 | 10/2001 | Higashi et al. |
| 6,317,381 B1 * | 11/2001 | Gans .............. G11C 7/22 365/194 |
| 6,373,738 B1 | 4/2002 | Towler et al. |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,480,931 B1 | 11/2002 | Buti et al. |
| 6,515,928 B2 | 2/2003 | Sato et al. |
| 6,567,340 B1 | 5/2003 | Nataraj et al. |
| 6,950,364 B2 | 9/2005 | Kim |
| 7,027,343 B2 | 4/2006 | Sinha et al. |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,444,577 B2 | 10/2008 | Best et al. |
| 7,551,502 B2 | 6/2009 | Dono et al. |
| 7,565,479 B2 | 7/2009 | Best et al. |
| 7,830,742 B2 | 11/2010 | Han |
| 8,174,921 B2 | 5/2012 | Kim et al. |
| 8,400,805 B2 | 3/2013 | Yoko |
| 8,451,677 B2 | 5/2013 | Okahiro et al. |
| 8,625,360 B2 | 1/2014 | Iwamoto et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,058,900 B2 | 6/2015 | Kang |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,251,885 B2 | 2/2016 | Greenfield et al. |
| 9,286,964 B2 | 3/2016 | Halbert et al. |
| 9,299,457 B2 | 3/2016 | Chun et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,412,432 B2 | 8/2016 | Narui et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,646,672 B1 | 5/2017 | Kim et al. |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,818,469 B1 | 11/2017 | Kim et al. |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 10,032,501 B2 | 7/2018 | Ito et al. |
| 10,083,737 B2 | 9/2018 | Bains et al. |
| 10,090,038 B2 | 10/2018 | Shin |
| 10,134,461 B2 | 11/2018 | Bell et al. |
| 10,147,472 B2 | 12/2018 | Jones et al. |
| 10,153,031 B2 | 12/2018 | Akamatsu |
| 10,170,174 B1 | 1/2019 | Ito et al. |
| 10,176,860 B1 | 1/2019 | Mylavarapu |
| 10,210,925 B2 | 2/2019 | Bains et al. |
| 10,297,305 B1 | 5/2019 | Moon et al. |
| 10,339,994 B2 | 7/2019 | Ito et al. |
| 10,381,327 B2 | 8/2019 | Ramachandra et al. |
| 10,387,276 B2 | 8/2019 | Ryu et al. |
| 10,446,216 B2 | 10/2019 | Oh et al. |
| 10,490,251 B2 | 11/2019 | Wolff |
| 10,600,462 B2 | 3/2020 | Augustine et al. |
| 10,600,491 B2 | 3/2020 | Chou et al. |
| 10,607,686 B2 | 3/2020 | Akamatsu |
| 10,629,286 B2 | 4/2020 | Lee et al. |
| 10,679,710 B2 | 6/2020 | Hirashima et al. |
| 10,705,900 B2 | 7/2020 | Jin |
| 10,770,127 B2 | 9/2020 | Shore et al. |
| 10,832,792 B1 | 11/2020 | Penney et al. |
| 10,861,519 B2 | 12/2020 | Jones et al. |
| 10,867,660 B2 | 12/2020 | Akamatsu |
| 10,943,636 B1 | 3/2021 | Wu et al. |
| 10,950,289 B2 | 3/2021 | Ito et al. |
| 10,964,378 B2 | 3/2021 | Ayyapureddi et al. |
| 2001/0008498 A1 | 7/2001 | Ooishi |
| 2002/0007476 A1 | 1/2002 | Kishino |
| 2002/0078311 A1 | 6/2002 | Matsuzaki et al. |
| 2002/0080677 A1 | 6/2002 | Watanabe et al. |
| 2002/0181301 A1 | 12/2002 | Takahashi et al. |
| 2003/0063512 A1 | 4/2003 | Takahashi et al. |
| 2003/0067825 A1 | 4/2003 | Shimano et al. |
| 2003/0090400 A1 | 5/2003 | Barker |
| 2003/0123301 A1 | 7/2003 | Jang et al. |
| 2003/0193829 A1 | 10/2003 | Morgan et al. |
| 2003/0231540 A1 | 12/2003 | Lazar et al. |
| 2004/0008544 A1 | 1/2004 | Shinozaki et al. |
| 2004/0022093 A1 | 2/2004 | Lee |
| 2004/0052142 A1 | 3/2004 | Ikehashi et al. |
| 2004/0114446 A1 | 6/2004 | Takahashi et al. |
| 2004/0130959 A1 | 7/2004 | Kawaguchi |
| 2004/0174757 A1 | 9/2004 | Garverick et al. |
| 2004/0184323 A1 | 9/2004 | Mori et al. |
| 2004/0218431 A1 | 11/2004 | Chung et al. |
| 2005/0105315 A1 | 5/2005 | Shin et al. |
| 2005/0243629 A1 | 11/2005 | Lee |
| 2005/0265104 A1 | 12/2005 | Remaklus et al. |
| 2006/0083099 A1 | 4/2006 | Bae et al. |
| 2006/0087903 A1 | 4/2006 | Riho et al. |
| 2006/0176744 A1 | 8/2006 | Stave |
| 2006/0262616 A1 | 11/2006 | Chen |
| 2007/0008799 A1 | 1/2007 | Dono et al. |
| 2007/0014174 A1 | 1/2007 | Ohsawa |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0133330 A1 | 6/2007 | Ohsawa |
| 2007/0230264 A1 | 10/2007 | Eto |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0224742 A1 | 9/2008 | Pomichter |
| 2008/0253212 A1 | 10/2008 | Iida et al. |
| 2008/0266990 A1 | 10/2008 | Loeffler |
| 2008/0288720 A1 | 11/2008 | Atwal et al. |
| 2008/0316845 A1 | 12/2008 | Wang et al. |
| 2009/0021999 A1 | 1/2009 | Tanimura et al. |
| 2009/0059641 A1 | 3/2009 | Jeddeloh |

(56) References Cited

U.S. PATENT DOCUMENTS

| | | | |
|---|---|---|---|
| 2009/0077571 A1* | 3/2009 | Gara | G06F 11/348 719/318 |
| 2009/0161457 A1 | 6/2009 | Wakimoto | |
| 2009/0168571 A1 | 7/2009 | Pyo et al. | |
| 2009/0185440 A1 | 7/2009 | Lee | |
| 2009/0201752 A1 | 8/2009 | Riho et al. | |
| 2009/0213675 A1 | 8/2009 | Shino | |
| 2009/0296510 A1 | 12/2009 | Lee et al. | |
| 2010/0005217 A1 | 1/2010 | Jeddeloh | |
| 2010/0005376 A1 | 1/2010 | Laberge et al. | |
| 2010/0054011 A1 | 3/2010 | Kim | |
| 2010/0074042 A1 | 3/2010 | Fukuda et al. | |
| 2010/0080074 A1 | 4/2010 | Ohmaru et al. | |
| 2010/0110809 A1 | 5/2010 | Kobayashi et al. | |
| 2010/0110810 A1 | 5/2010 | Kobayashi | |
| 2010/0131812 A1 | 5/2010 | Mohammad | |
| 2010/0157693 A1 | 6/2010 | Iwai et al. | |
| 2010/0182863 A1 | 7/2010 | Fukiage | |
| 2010/0329069 A1 | 12/2010 | Ito et al. | |
| 2011/0026290 A1 | 2/2011 | Noda et al. | |
| 2011/0051530 A1 | 3/2011 | Kushida | |
| 2011/0055495 A1 | 3/2011 | Remaklus, Jr. et al. | |
| 2011/0069572 A1 | 3/2011 | Lee et al. | |
| 2011/0216614 A1 | 9/2011 | Hosoe | |
| 2011/0225355 A1 | 9/2011 | Kajigaya | |
| 2011/0286271 A1 | 11/2011 | Chen | |
| 2011/0310648 A1 | 12/2011 | Iwamoto et al. | |
| 2012/0014199 A1 | 1/2012 | Narui | |
| 2012/0059984 A1 | 3/2012 | Kang et al. | |
| 2012/0151131 A1 | 6/2012 | Kilmer et al. | |
| 2012/0213021 A1 | 8/2012 | Riho et al. | |
| 2012/0254472 A1 | 10/2012 | Ware et al. | |
| 2013/0003467 A1 | 1/2013 | Klein | |
| 2013/0003477 A1 | 1/2013 | Park et al. | |
| 2013/0057173 A1 | 3/2013 | Yao et al. | |
| 2013/0107623 A1 | 5/2013 | Kavalipurapu et al. | |
| 2013/0173971 A1 | 7/2013 | Zimmerman | |
| 2013/0254475 A1 | 9/2013 | Perego et al. | |
| 2013/0304982 A1 | 11/2013 | Jung et al. | |
| 2014/0006703 A1 | 1/2014 | Bains et al. | |
| 2014/0006704 A1 | 1/2014 | Greenfield et al. | |
| 2014/0013169 A1 | 1/2014 | Kobla et al. | |
| 2014/0013185 A1 | 1/2014 | Kobla et al. | |
| 2014/0050004 A1 | 2/2014 | Mochida | |
| 2014/0078841 A1 | 3/2014 | Chopra | |
| 2014/0078842 A1 | 3/2014 | Oh et al. | |
| 2014/0078845 A1 | 3/2014 | Song | |
| 2014/0089576 A1 | 3/2014 | Bains et al. | |
| 2014/0095780 A1 | 4/2014 | Bains et al. | |
| 2014/0095786 A1 | 4/2014 | Moon et al. | |
| 2014/0119091 A1 | 5/2014 | You et al. | |
| 2014/0136763 A1 | 5/2014 | Li et al. | |
| 2014/0143473 A1 | 5/2014 | Kim et al. | |
| 2014/0177370 A1 | 6/2014 | Halbert et al. | |
| 2014/0189228 A1 | 7/2014 | Greenfield et al. | |
| 2014/0219043 A1 | 8/2014 | Jones et al. | |
| 2014/0237307 A1 | 8/2014 | Kobla et al. | |
| 2014/0241099 A1 | 8/2014 | Seo et al. | |
| 2014/0254298 A1 | 9/2014 | Dally | |
| 2014/0269021 A1 | 9/2014 | Yang et al. | |
| 2014/0281206 A1 | 9/2014 | Crawford et al. | |
| 2014/0281207 A1 | 9/2014 | Mandava et al. | |
| 2014/0292375 A1 | 10/2014 | Angelini et al. | |
| 2014/0293725 A1 | 10/2014 | Best et al. | |
| 2014/0355332 A1 | 12/2014 | Youn et al. | |
| 2015/0049567 A1 | 2/2015 | Chi | |
| 2015/0055420 A1 | 2/2015 | Bell et al. | |
| 2015/0078112 A1 | 3/2015 | Huang | |
| 2015/0089326 A1 | 3/2015 | Joo et al. | |
| 2015/0155027 A1 | 6/2015 | Abe et al. | |
| 2015/0162067 A1 | 6/2015 | Kim et al. | |
| 2015/0170728 A1 | 6/2015 | Jung et al. | |
| 2015/0199126 A1 | 7/2015 | Jayasena et al. | |
| 2015/0206572 A1 | 7/2015 | Lim et al. | |
| 2015/0213872 A1 | 7/2015 | Mazumder et al. | |
| 2015/0213877 A1 | 7/2015 | Darel | |
| 2015/0228341 A1 | 8/2015 | Watanabe et al. | |
| 2015/0243339 A1 | 8/2015 | Bell et al. | |
| 2015/0255140 A1 | 9/2015 | Song | |
| 2015/0262652 A1* | 9/2015 | Igarashi | G11C 11/408 711/106 |
| 2015/0279441 A1 | 10/2015 | Greenberg et al. | |
| 2015/0279442 A1 | 10/2015 | Hwang | |
| 2015/0294711 A1 | 10/2015 | Gaither et al. | |
| 2015/0340077 A1 | 11/2015 | Akamatsu | |
| 2015/0356048 A1 | 12/2015 | King | |
| 2016/0019940 A1 | 1/2016 | Jang et al. | |
| 2016/0027498 A1 | 1/2016 | Ware et al. | |
| 2016/0027531 A1 | 1/2016 | Jones et al. | |
| 2016/0027532 A1 | 1/2016 | Kim | |
| 2016/0042782 A1 | 2/2016 | Narui et al. | |
| 2016/0078845 A1 | 3/2016 | Lin et al. | |
| 2016/0078911 A1 | 3/2016 | Fujiwara et al. | |
| 2016/0078918 A1 | 3/2016 | Hyun et al. | |
| 2016/0086649 A1 | 3/2016 | Hong et al. | |
| 2016/0086651 A1 | 3/2016 | Kim | |
| 2016/0093402 A1 | 3/2016 | Kitagawa et al. | |
| 2016/0099043 A1 | 4/2016 | Tu | |
| 2016/0125931 A1 | 5/2016 | Doo et al. | |
| 2016/0133314 A1 | 5/2016 | Hwang et al. | |
| 2016/0140243 A1 | 5/2016 | Adams et al. | |
| 2016/0172056 A1 | 6/2016 | Huh | |
| 2016/0180917 A1 | 6/2016 | Chishti et al. | |
| 2016/0180921 A1 | 6/2016 | Jeong | |
| 2016/0196863 A1 | 7/2016 | Shin et al. | |
| 2016/0202926 A1 | 7/2016 | Benedict | |
| 2016/0211008 A1 | 7/2016 | Benedict et al. | |
| 2016/0225433 A1 | 8/2016 | Bains et al. | |
| 2016/0225461 A1 | 8/2016 | Tuers et al. | |
| 2016/0336060 A1 | 11/2016 | Shin | |
| 2016/0343423 A1 | 11/2016 | Shido | |
| 2017/0011792 A1 | 1/2017 | Oh et al. | |
| 2017/0076779 A1 | 3/2017 | Bains et al. | |
| 2017/0092350 A1 | 3/2017 | Halbert et al. | |
| 2017/0117030 A1 | 4/2017 | Fisch et al. | |
| 2017/0133085 A1 | 5/2017 | Kim et al. | |
| 2017/0139641 A1 | 5/2017 | Cha et al. | |
| 2017/0140807 A1 | 5/2017 | Sun et al. | |
| 2017/0140811 A1 | 5/2017 | Joo | |
| 2017/0148504 A1 | 5/2017 | Saifuddin et al. | |
| 2017/0177246 A1 | 6/2017 | Miller et al. | |
| 2017/0186481 A1 | 6/2017 | Oh et al. | |
| 2017/0213586 A1 | 7/2017 | Kang et al. | |
| 2017/0221546 A1 | 8/2017 | Loh et al. | |
| 2017/0263305 A1 | 9/2017 | Cho | |
| 2017/0287547 A1 | 10/2017 | Ito et al. | |
| 2017/0323675 A1 | 11/2017 | Jones et al. | |
| 2017/0352399 A1* | 12/2017 | Yokoyama | G11C 7/062 |
| 2017/0371742 A1 | 12/2017 | Shim et al. | |
| 2017/0372767 A1 | 12/2017 | Kang et al. | |
| 2018/0005690 A1 | 1/2018 | Morgan et al. | |
| 2018/0025770 A1 | 1/2018 | Ito et al. | |
| 2018/0025772 A1 | 1/2018 | Lee et al. | |
| 2018/0060194 A1 | 3/2018 | Ryu et al. | |
| 2018/0061483 A1 | 3/2018 | Morgan | |
| 2018/0082737 A1 | 3/2018 | Lee | |
| 2018/0084314 A1 | 3/2018 | Koyama | |
| 2018/0090199 A1 | 3/2018 | Kim et al. | |
| 2018/0096719 A1 | 4/2018 | Tomishima et al. | |
| 2018/0102776 A1 | 4/2018 | Chandrasekar et al. | |
| 2018/0107417 A1 | 4/2018 | Shechter et al. | |
| 2018/0114561 A1 | 4/2018 | Fisch et al. | |
| 2018/0114565 A1 | 4/2018 | Lee | |
| 2018/0158504 A1 | 6/2018 | Akamatsu | |
| 2018/0182445 A1* | 6/2018 | Lee | G11C 8/06 |
| 2018/0203621 A1 | 7/2018 | Ahn et al. | |
| 2018/0218767 A1 | 8/2018 | Wolff | |
| 2018/0261268 A1 | 9/2018 | Hyun et al. | |
| 2018/0294028 A1 | 10/2018 | Lee et al. | |
| 2018/0308539 A1 | 10/2018 | Ito et al. | |
| 2018/0341553 A1 | 11/2018 | Koudele et al. | |
| 2019/0013059 A1 | 1/2019 | Akamatsu | |
| 2019/0043558 A1 | 2/2019 | Suh et al. | |
| 2019/0051344 A1 | 2/2019 | Bell et al. | |

(56) References Cited

U.S. PATENT DOCUMENTS

| | | |
|---|---|---|
| 2019/0066759 A1 | 2/2019 | Nale |
| 2019/0066762 A1 | 2/2019 | Koya |
| 2019/0088315 A1 | 3/2019 | Saenz et al. |
| 2019/0088316 A1 | 3/2019 | Inuzuka et al. |
| 2019/0096492 A1 | 3/2019 | Cai et al. |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0147941 A1 | 5/2019 | Qin et al. |
| 2019/0161341 A1 | 5/2019 | Howe |
| 2019/0196730 A1 | 6/2019 | Imran |
| 2019/0198090 A1 | 6/2019 | Lee |
| 2019/0198099 A1 | 6/2019 | Mirichigni et al. |
| 2019/0205253 A1 | 7/2019 | Roberts |
| 2019/0207736 A1* | 7/2019 | Ben-Tovim ........... H04L 5/0087 |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237132 A1 | 8/2019 | Morohashi |
| 2019/0243708 A1 | 8/2019 | Cha et al. |
| 2019/0252020 A1 | 8/2019 | Rios |
| 2019/0267077 A1 | 8/2019 | Ito et al. |
| 2019/0279706 A1 | 9/2019 | Kim |
| 2019/0333573 A1 | 10/2019 | Shin et al. |
| 2019/0348100 A1 | 11/2019 | Smith et al. |
| 2019/0348107 A1 | 11/2019 | Shin et al. |
| 2019/0349545 A1* | 11/2019 | Koh ..................... H04N 5/3575 |
| 2019/0362774 A1 | 11/2019 | Kuramori et al. |
| 2019/0371391 A1 | 12/2019 | Cha et al. |
| 2019/0385661 A1 | 12/2019 | Koo et al. |
| 2019/0385667 A1 | 12/2019 | Morohashi et al. |
| 2020/0005857 A1 | 1/2020 | Ito et al. |
| 2020/0075106 A1 | 3/2020 | Tokutomi et al. |
| 2020/0082873 A1 | 3/2020 | Wolff |
| 2020/0090760 A1 | 3/2020 | Purahmad et al. |
| 2020/0135263 A1 | 4/2020 | Brown et al. |
| 2020/0194050 A1 | 6/2020 | Akamatsu |
| 2020/0194056 A1 | 6/2020 | Sakurai et al. |
| 2020/0201380 A1* | 6/2020 | Murali ..................... G06F 1/08 |
| 2020/0202921 A1 | 6/2020 | Morohashi et al. |
| 2020/0211626 A1 | 7/2020 | Hiscock et al. |
| 2020/0211633 A1 | 7/2020 | Okuma |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0302994 A1 | 9/2020 | Enomoto et al. |
| 2020/0349995 A1 | 11/2020 | Shore et al. |
| 2020/0365208 A1 | 11/2020 | Schreck et al. |
| 2020/0381040 A1 | 12/2020 | Penney et al. |
| 2020/0395072 A1 | 12/2020 | Penney et al. |
| 2021/0020262 A1 | 1/2021 | Penney et al. |
| 2021/0026732 A1 | 1/2021 | Park et al. |
| 2021/0065755 A1 | 3/2021 | Kim et al. |
| 2021/0065764 A1 | 3/2021 | Cheng et al. |
| 2021/0158861 A1 | 5/2021 | Jeong et al. |
| 2021/0201984 A1 | 7/2021 | Khasawneh et al. |
| 2021/0225432 A1 | 7/2021 | Enomoto et al. |
| 2021/0265504 A1 | 8/2021 | Ishizu et al. |

FOREIGN PATENT DOCUMENTS

| | | |
|---|---|---|
| CN | 101067972 A | 11/2007 |
| CN | 101331554 A | 12/2008 |
| CN | 101458658 A | 6/2009 |
| CN | 101622607 A | 1/2010 |
| CN | 102113058 A | 6/2011 |
| CN | 102483952 A | 5/2012 |
| CN | 104350546 A | 2/2015 |
| CN | 106710621 A | 5/2017 |
| CN | 107871516 A | 4/2018 |
| CN | 2019222960 A | 4/2018 |
| JP | H0773682 A | 3/1995 |
| JP | 2005-216429 A | 8/2005 |
| JP | 2011-258259 | 12/2011 |
| JP | 2011-258259 A | 12/2011 |
| JP | 4911510 B2 | 1/2012 |
| JP | 2013-004158 A | 1/2013 |
| KR | 1020180064940 A | 6/2018 |
| KR | 1020180085184 A | 7/2018 |
| WO | 2014120477 | 8/2014 |
| WO | 2015030991 A1 | 3/2015 |
| WO | 2017171927 A1 | 10/2017 |
| WO | 2020010010 A1 | 1/2020 |
| WO | 2020191222 A1 | 9/2020 |

OTHER PUBLICATIONS

U.S. Appl. No. 16/268,818, titled "Apparatuses and Methods for Managing Row Access Counts", filed Feb. 6, 2019.
U.S. Appl. No. 16/358,587, titled "Semiconductor Device Having CAM That Stores Address Signals", dated Mar. 19, 2019.
U.S. Appl. No. 16/411,573 titled "Apparatuses, Systems, and Methods for a Content Addressable Memory Cell" filed May 14, 2019.
U.S. Appl. No. 16/427,330 titled "Apparatuses and Methods for Storing Victim Row Data" filed May 30, 2019.
U.S. Appl. No. 16/428,625 titled "Apparatuses and Methods for Tracking Victim Rows" filed May 31, 2019.
U.S. Appl. No. 16/459,520 titled "Apparatuses and Methods for Monitoring Word Line Accesses", filed Jul. 1, 2019, pp. all.
Kim, et al., "Flipping Bits in MemoryWithout Accessing Them: An Experimental Study of DRAM Disturbance Errors", IEEE, Jun. 2014, 12 pgs.
U.S. Appl. No. 16/797,658, titles "Apparatuses and Methods for Controlling Refresh Operations", filed Feb. 21, 2020.
U.S. Appl. No. 15/881,256 entitled 'Apparatuses and Methods for Detecting a Row Hammer Attack With a Bandpass Filter' filed on Jan. 26, 2018.
U.S. Appl. No. 16/513,400 titled "Apparatuses and Methods for Tracking Row Accesses" filed Jul. 16, 2019.
U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory" filed on Oct. 27, 2017; pp. all.
U.S. Appl. No. 16/176,932, titled "Apparatuses and Methods for Access Based Refresh Timing", filed Oct. 31, 2018.
U.S. Appl. No. 16/237,291, titled "Apparatus and Methods for Refreshing Memory", filed Dec. 31, 2018.
U.S. Appl. No. 16/805,197, titled "Apparatuses and Methods for Calculating Row Hammer Refresh Addresses in a Semiconductor Device", dated Feb. 28, 2020.
U.S. Appl. No. 16/546,152 titled "Apparatuses and Methods for Analog Row Access Tracking" filed Aug. 20, 2019.
U.S. Appl. No. 16/548,027 titled "Apparatuses, Systems, and Methods for Analog Row Access Rate Determination" filed Aug. 22, 2019.
U.S. Appl. No. 16/425,525 titled "Apparatuses and Methods for Tracking All Row Accesses" filed May 29, 2019.
U.S. Appl. No. 16/427,105 titled "Apparatuses and Methods for Priority Targeted Refresh Operations" filed May 30, 2019.
U.S. Appl. No. 16/427,140 titled "Apparatuses and Methods for Tracking Row Access Counts Between Multiple Register Stacks" filed May 30, 2019.
U.S. Appl. No. 16/437,811 titled "Apparatuses, Systems, and Methods for Determining Extremum Numerical Values" filed Jun. 11, 2019.
U.S. Appl. No. 16/936,297 titled "Apparatuses and Methods for Managing Row Access Counts" filed July 22, 2020.
Thomas, et al., "Voltage Source Based Voltage-to-Time Converter", IEEE, 2020, p. All.
U.S. Appl. No. 17/102,266, titled "Apparatuses and Methods for Tracking Word Line Accesses", dated Nov. 23, 2020.
U.S. Appl. No. 17/154,945 titled "Apparatuses, Systems, and Methods for a Content Addressable Memory Cell" filed Jan. 21, 2021, pp. all.
U.S. Appl. No. 17/168,036 titled "Apparatuses and Methods for Analog Row Access Tracking" filed Feb. 4, 2021, pp. all.

(56) References Cited

OTHER PUBLICATIONS

U.S. Appl. No. 17/170,616 titled "Apparatuses, Systems, and Methods for Analog Row Access Rate Determination" filed Feb. 8, 2021, pp. all.
U.S. Appl. No. 16/084,119, titled "Apparatuses and Methods for Pure-Time, Self Adopt Sampling for Row Hammer Refresh Sampling", filed Sep. 11, 2018, pp. all.
U.S. Appl. No. 16/886,284 titled "Apparatuses and Methods for Access Based Refresh Timing" filed May 28, 2020, pp. all.
U.S. Appl. No. 16/886,284, titled "Apparatuses and Methods for Access Based Refresh Timing", dated May 28, 2020, pp. all.
U.S. Appl. No. 16/375,716 titled "Apparatuses and Methods for Staggered Timing of Targeted Refresh Operations" filed on Apr. 4, 2019; pp. all.
U.S. Appl. No. 17/060,403 titled "Apparatuses and Methods for Adjusting Victim Data" filed Oct. 1, 2020, pp. all.
U.S. Appl. No. 16/549,411 titled "Apparatuses and Methods for Dynamic Refresh Allocation" filed Aug. 23, 2019, pp. all
U.S. Appl. No. 16/655,110 titled "Apparatuses and Methods for Dynamic Targeted Refresh Steals" filed Oct. 16, 2019, pp. all.
U.S. Appl. No. 16/788,657, titled "Semiconductor Device Performing Row Hammer Refresh Operation", dated Feb. 12, 2020, pp. all.
U.S. Appl. No. 16/537,981 titled "Apparatuses and Methods for Controlling Targeted Refresh Rates" filed Aug. 12, 2019, pp. all.
U.S. Appl. No. 17/153,555 titled "Apparatuses and Methods for Dynamically Allocated Aggressor Detection" filed Jan. 20, 2021, pp. all.
U.S. Appl. No. 17/201,941 titled "Apparatuses and Methods for Sketch Circuits for Refresh Binning" filed Mar. 15, 2021, pp. all.

U.S. Appl. No. 17/301,533 titled "Semiconductor Device Having CAM That Stores Address Signals" filed Apr. 6, 2021, pp. all.
U.S. Appl. No. 16/208.217, titled "Semiconductor Device Performing Row Hammer Refresh Operation", filed Dec. 3, 2018, pp. all
U.S. Appl. No. 16/230,300, titled "Apparatuses and Methods for Staggered Timing of Targeted Refresh Operations" filed Dec. 21, 2018, pp. all.
U.S. Appl. No. 16/290,730, titled "Semiconductor Device Performing Row Hammer Refresh Operation", filed Mar. 1, 2019, pp. all.
U.S. Appl. No. 16/374,623, titled "Semiconductor Device Performing Row Hammer Refresh Operation", filed Apr. 3, 2019, pp. all.
U.S. Appl. No. 16/431,641 titled "Apparatuses and Methods for Controlling Steal Rates" filed Jun. 4, 2019, pp. all.
U.S. Appl. No. 16/682,606, titled "Apparatuses and Methods for Distributing Row Hammer Refresh Events Across a Memory Device ", filed Nov. 13, 2019, pp. all.
U.S. Appl. No. 16/459,507 titled "Apparatuses and Methods for Adjusting Victim Data", filed Jul. 1, 2019, pp. all.
U.S. Appl. No. 17/375,817 titled "Apparatuses and Methods for Monitoring Word Line Accesses" filed Jul. 14, 2021, pp. all.
U.S. Appl. No. 17/007,069 titled "Apparatuses and Methods for Providing Refresh Addresses" filed Aug. 31, 2020, pp. all.
U.S. Appl. No. 17/443,056 titled "Apparatuses and Methods for Multiple Row Hammer Refresh Address Sequences" filed Jul. 20, 2021, pp. all.
U.S. Appl. No. 17/444,925 titled "Apparatuses and Methods for Countering Memory Attacks" filed Aug. 12, 2021, pp. all.
U.S. Appl. No. 17/446,710 titled "Apparatuses, Systems, and Methods for Determining Extremum Numerical Values" filed Sep. 1, 2021, pp. all.
U.S. Appl. No. 17/470,883 titled "Apparatuses and Methods for Tracking Victim Rows" filed Sep. 9, 2021, pp. all.

* cited by examiner

APPARATUSES AND METHODS FOR LOSSY ROW ACCESS COUNTING

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. Repeated access to a particular memory cell or group of memory cells (often referred to as a 'row hammer') may cause an increased rate of data degradation in nearby memory cells. It may be desirable to identify and refresh memory cells affected by the row hammer effect. Accesses to different rows may be tracked over time to identify memory cells affected by the row hammer effect.

DETAILED DESCRIPTION

Figure 1:
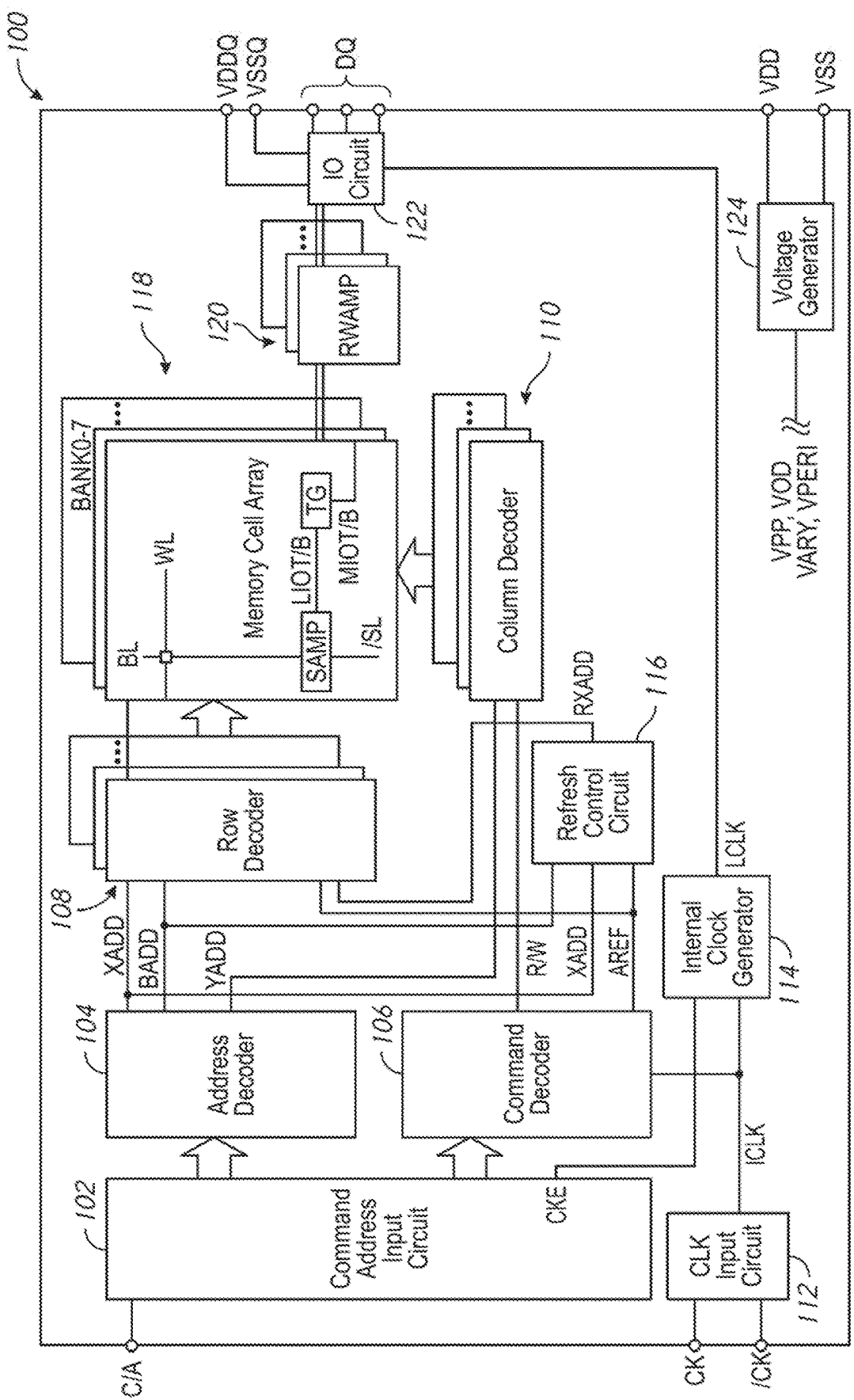
FIG. 1 is a block diagram of a semiconductor device according an embodiment of the disclosure.

The following description of certain embodiments is merely exemplary in, nature and is in no way intended to limit the scope of the disclosure or its applications or uses, in the following detailed description of embodiments of the present systems and methods, reference is made to the accompanying drawings which form a part hereof and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (wordlines) and columns (bit lines), and the memory cells may be refreshed on a row-by-row basis. Repeated access to a particular row of memory (e.g., an aggressor row) may cause an increased rate of decay in neighboring rows (e.g., victim rows) due, for example, to electromagnetic coupling between the rows. In order to prevent information from being lost, it may be necessary to identify aggressor rows so that the corresponding victim rows can be refreshed.

Row access operations may be monitoring to determine which rows are aggressors (or potential aggressors). For example, a memory device may store certain row addresses and may count accesses to those stored row addresses. The count may be updated (e.g., incremented) each time received address matches one of the stored addresses, and if the received address does not match the stored addresses, it may replace one of the stored addresses (e.g., it may replace the address with the lowest count). Actual accesses to a memory device may be very noisy, in that a frequently accessed row address may still be interspersed among accesses to many other row addresses which are less frequently accessed. In some cases this may lead to a situation where enough noise rows are accessed that they replace a stored address which represents an aggressor row, which in turn may cause that aggressor row to be missed by the device. It may be desirable to use a filter while monitoring row accesses to ensure that true positives (e.g., aggressor rows) are maintained and counted, while less frequently accessed rows are filtered out.

The present disclosure is drawn to apparatuses systems, and methods for lossy row access counting. A memory device may contain a data storage unit such as a register stack, which contains a number of registers. Each register stores a row address and is associated with a count value. When an address is received, if it matches one of the stored row addresses, the counter associated with that register is updated in a first direction (e.g., increased). In addition, periodically (e.g., responsive to an oscillator signal) all of the count values may be updated in a second direction different from the first direction (e.g., decreased).

The periodic updates may act as a filter. For example, in an embodiment where counts are incremented when there is a match, and periodically decremented, rows (e.g., aggressor rows) which are accessed more frequently than the periodic decrementing have count values which continue to increase, while rows which are accessed less than or at about the same rate as the periodic decrements have count values which will remain close to 0. The frequency at which the count values are periodically changed may be tuned to set a threshold rate below which noise rows are filtered out, and above which potential aggressor rows are not filtered out.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is output to outside from the data terminals DQ via the input/output circuit 122.

The device 100 may receive an access command which is a write command. When the write command is received, and a bank address, a row address and a column address are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and may cause the device 100 to return to an idle state and/or resume other operations.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. In some embodiments, the number of wordlines represented by the refresh address RXADD may vary from one refresh address to another. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of wordlines represented by the address), or may operate based on internal logic.

The refresh control circuit 116 may selectively output a targeted refresh address (e.g., a victim address) or an automatic refresh address (auto-refresh address) as the refresh address RXADD. The automatic refresh addresses may be from a sequence of addresses which are provided based on activations of the refresh signal AREF. The refresh control circuit 116 may cycle through the sequence of auto-refresh addresses at a rate determined by AREF. In some embodiments, the auto-refresh operations may generally occur with a timing such that the sequence of auto-refresh addresses is cycled such that no information is expected to degrade in the time between auto-refresh operations for a given wordline. In other words, auto-refresh operations may be performed such that each wordline is refreshed at a rate faster than the expected rate of information decay.

The refresh control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118. The refresh control circuit 116 may use one or more signals of the device 100 to calculate the targeted refresh address RXADD. For example, the refresh address RXADD may be a calculated based on the row addresses XADD provided by the address decoder.

In some embodiments, the refresh control circuit 116 may sample the current value of the row address XADD provided by the address decoder 104 along a row address bus, and determine a targeted refresh address based on one or more of the sampled addresses. The sampled addresses may be stored in the refresh control circuit, and each stored address may be associated with a count value. When a row address XADD is sampled, it may be compared to the stored addresses. If the row address XADD does match a stored address, the count value associated with that stored address may be updated in a first direction (e.g., increased). In addition, all of the count values may periodically be updated in a second direction (e.g., decreased). When a targeted refresh operation occurs, one of the stored addresses may be selected based, in part, on the count value, and one or more refresh addresses RXADD may be based on the selected address.

While in general the present disclosure refers to determining aggressor and victim wordlines and addresses, it should be understood that as used herein, an aggressor wordline does not necessarily need to cause data degradation in neighboring wordlines, and a victim wordline does not necessarily need to be subject to such degradation. The refresh control circuit 116 may use some criteria to judge whether an address is an aggressor address, which may capture potential aggressor addresses rather than definitively determining which addresses are aggressors. For example, the refresh control circuit 116 may determine potential aggressor addresses based on a pattern of accesses to the addresses and this criteria may include some addresses which are not aggressors, and miss some addresses which are. Similar victim addresses may be determined based on which wordlines are expected to be effected by aggressors, rather than a definitive determination of which wordlines are undergoing an increased rate of data decay.

The refresh address RXADD may be provided with a timing based on a timing of the refresh signal AREF. The refresh control circuit 116 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto-refresh address. In some embodiments, certain time slots may be reserved for targeted refresh addresses, and the refresh control circuit 116 may determine whether to provide a targeted refresh address, not provide an address during that time slot, or provide an auto-refresh address instead during the time slot.

The targeted refresh address may be based on characteristics over time of the row addresses XADD received from the address decoder 104. For example, the refresh control circuit 116 may sample the current row address XADD as it is provided cm the row address bus to determine its characteristics over time. The sampling may occur intermittently, with each sample acquired based on a random or semi-random timing. The refresh control circuit 116 may use different methods to calculate a targeted refresh address based on the sampled row address XADD. For example, the refresh control circuit 116 may determine if a given row is an aggressor address, and then calculate and provide addresses corresponding to victim addresses of the aggressor address as the targeted refresh address. In some embodiments, more than one victim address may correspond to a given aggressor address. In this case the refresh control circuit may queue up multiple targeted refresh addresses, and provide them sequentially when it determines that a targeted refresh address should be provided. The refresh control circuit 116 may provide the targeted refresh address right away, or may queue up the targeted refresh address to be provided at a later time e.g., in the next time slot available for a targeted refresh).

The refresh control circuit 116 may use 'lossy counting' to determine aggressor addresses. When a row address XADD is sampled by the refresh control circuit 116, it may be compared to previously sampled addresses stored in a data storage unit (e.g., a register stack). Each of the stored addresses is associated with a count value. When the sampled address XADD matches one of the stored addresses, the count value associated with that stored address may be updated in a first direction (e.g., incremented). Periodically (e.g., at a certain frequency) all of the count values may be updated in a second direction (e.g., decremented). The address associated with the maximum count may be identified as the aggressor address. If there is not a match between the sampled address and one of the stored addresses, then the sampled address may be stored in the data storage unit. In some embodiments, the timing at which the count values are updated in the second direction may generally be independent of the timing at which addresses are sampled. In some embodiments, the sampling operation may be suppressed when the period updating occurs.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
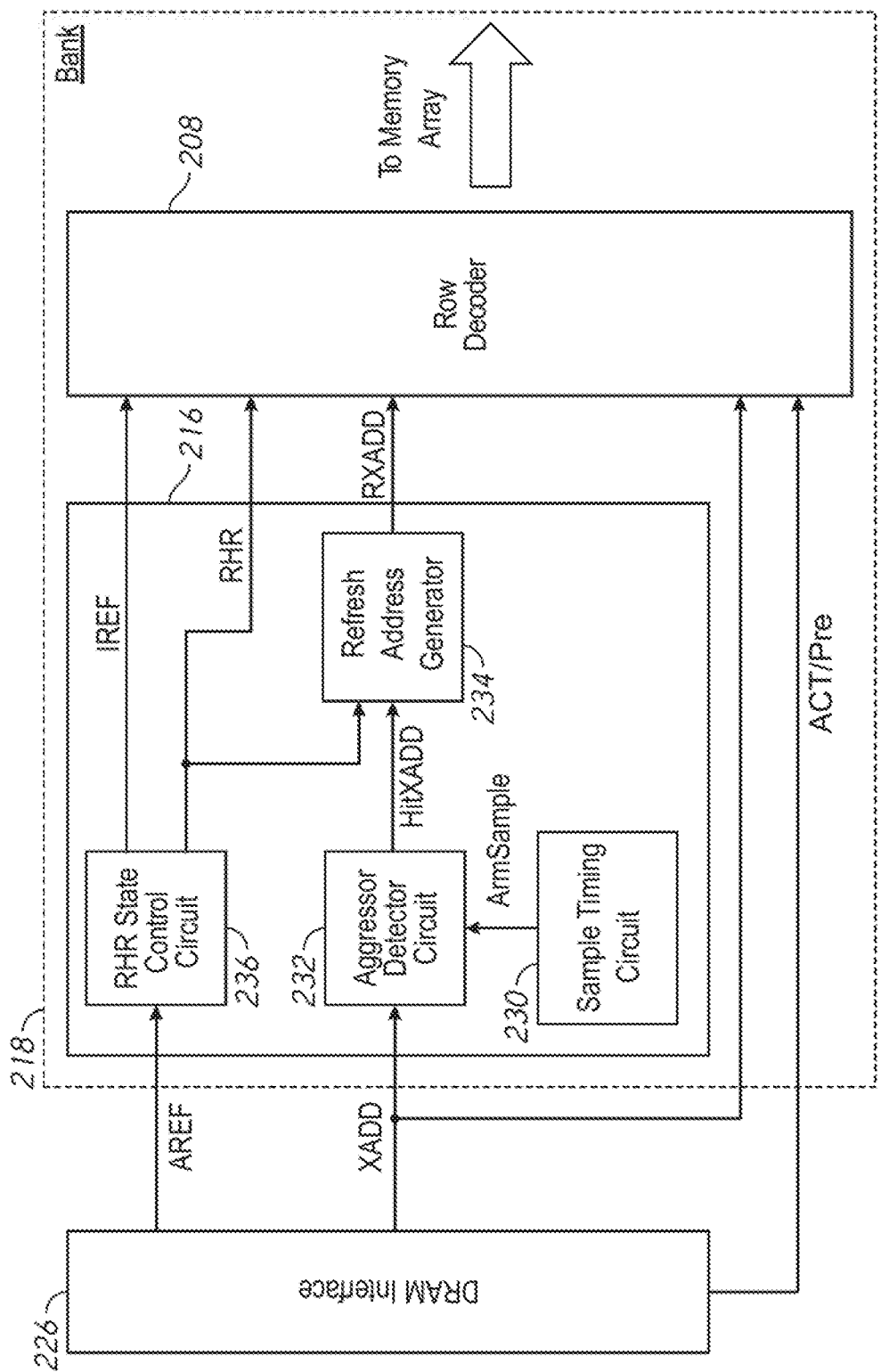
FIG. 2 is a block diagram of a refresh control circuit according to an embodiment of the present disclosure.

FIG. 2 is a block diagram of a refresh control circuit according to an embodiment of the present disclosure. The refresh control circuit 216 may, in some embodiments, be included in the refresh control circuit 116 of FIG. 1. Certain internal components and signals of the refresh control circuit 216 are shown to illustrate the operation of the refresh control circuit 216. The dotted line 218 is shown to represent that in certain embodiments, each of the components the refresh control circuit 216 and row decoder 208) may correspond to a particular bank of memory, and that these components may be repeated for each of the banks of memory. Thus, there may be multiple refresh control circuits 216 and row decoders 208. For the sake of brevity, only components for a single bank will be described.

A DRAM interface 226 may provide one or more signals to an address refresh control circuit 216 and row decoder 208. The refresh control circuit 216 may include a sample timing circuit 230, an aggressor detector circuit 232, a row hammer refresh (RHR) state control circuit 236 and a refresh address generator 234. The DRAM interface 226 may provide one or more control signals, such as a refresh signal AREF, and a row address XADD. The refresh control circuit 216 provides refresh address RXADD with timing based on the refresh signal AREF, wherein some of the refresh addresses are based on the received row address XADD.

The aggressor detector circuit 232 may sample the current row address XADD responsive to an activation a sampling signal ArmSample. The aggressor detector circuit 232 may be coupled to all of the row addresses XADD along the row address bus, but may only receive (e.g., process, pay attention to) the current value of the row address XADD when there is an activation of the sampling signal ArmSample. As used herein, an activation of a sample may refer to any portion of a signals waveform that a circuit responds to. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level.

In some embodiments, the sampled addresses may be stored in the aggressor circuit 232 and/or compared to previously stored addresses. The aggressor detector circuit 232 may provide a match address HitXADD based on a currently sampled row address XADD and/or previously sampled row addresses. The RFIR state control circuit 236 may provide the signal RHR to indicate that a row hammer refresh (e.g., a refresh of the victim rows corresponding to an identified aggressor row) should occur. The RHR state control circuit 236 may also provide an internal refresh signal IREF, to indicate that an auto-refresh should occur. Responsive to an activation of RHR or IREF, the refresh address generator 234 may provide a refresh address RXADD, which may be an auto-refresh address or may be one or more victim addresses corresponding to victim rows of the aggressor row corresponding to the match address HitXADD. The row decoder 208 may perform a refresh operation responsive to the refresh address RXADD and the row hammer refresh signal RHR. The row decoder 208 may perform an auto-refresh operation based on the refresh address RXADD and the internal refresh signal IREF.

The DRAM interface 226 may represent one or more components which provides signals to components of the bank. In some embodiments, the DRAM interface 226 may represent a memory controller coupled to the semiconductor memory device (e.g., device 100 of FIG. 1). In some embodiments, the DRAM interface 226 may represent components such as the command address input circuit 102, the address decoder 104, and/or the command decoder 106 of FIG. 1. The DRAM interface 226 may provide a row address XADD, the refresh signal AREF, and access signals such as an activation signal ACT and a pre-charge signal Pre. The refresh signal AREF may be a periodic signal which may indicate when an auto-refresh operation is to occur. The access signals ACT and PRE may generally be provided as part of an access operation along with a row address XADD. The activation signal ACT may be provided to activate a given bank of the memory. The pre-charge signal PRE may be provided to pre-charge the given bank of the memory. The row address XADD may be a signal including multiple bits (which may be transmitted in series or in parallel) and may correspond to a specific row of an activated memory bank.

In the example embodiment of FIG. 2, the refresh control circuit 216 uses sampling to monitor a portion of the row addresses XADD provided along the row address bus. Accordingly, instead of responding to every row address, the refresh control circuit 216 may sample the current value of the row address XADD on the row address bus, and may determine which addresses are aggressors based on the sampled row addresses. The timing of sampling by the refresh control circuit 216 may be controlled by the sample timing circuit 230 which provides the sampling signal ArmSample. The sample timing circuit 230 may provide activations of the sampling signal ArmSample, and each activation of the signal ArmSample may indicate that a current value of the row address should be sampled. An activation of ArmSample may be a 'pulse', where ArmSample is raised to a high logic level and then returns to a low logic level. The activations of the signal ArmSample may be provided with regular timing, random timing, semi-random timing, pseudo-random timing, or combinations thereof. In other embodiments, sampling may not be used, and the aggressor detector circuit 232 may receive every value of the row address XADD along the row address bus.

The aggressor detector circuit 232 may receive the row address XADD from the DRAM interface 226 and the signal ArmSample from the sample timing circuit 230. The row address XADD on the row address bus may change as the DRAM interface 226 directs access operations (e.g., read and write operations) to different rows of the memory cell array (e.g., memory cell array 118 of FIG. 1). Each time the aggressor detector circuit 232 receives an activation (e.g., a pulse) of the signal ArmSample, the aggressor detector circuit 232 may sample the current value of XADD.

As described in more detail herein, the aggressor detector circuit 232 may determine aggressor addresses based on one or more of the sampled row addresses, and then may provide the determined aggressor address as the match address HitXADD. The aggressor detector circuit 232 may include a data storage unit (e.g., a number of registers), which may be used to store sampled row addresses. Each stored address is associated with a count value. When the aggressor detector circuit 232 samples a new value of the row address XADD (e.g., responsive to an activation of ArmSample) it may compare the sampled row address to the addresses stored in the data storage unit. If there is a match between the sampled address and one of the stored addresses, the count value associated with that stored address may be changed in a first direction (e.g., increased). The count values may therefore be based, in part, on a number of accesses to the associated row address. The aggressor detector circuit 232 may also periodically change all of the stored count values in a second direction (e.g., decrease them). The aggressor detector circuit 232 may provide the stored address associated with the highest count value (e.g., the maximum of the count values) as the match address HitXADD. The operation of an example aggressor detector circuit is discussed in detail in FIGS. 3-5.

As used herein, the disclosure may generally refer to the address associated with the highest count being used for refresh operations, while the address associated with the lowest count may be replaced. This may generally be used in embodiments where counts are increased in response to their addresses matching the sampled address, and where all the count values are periodically decreased. In embodiments where this is reversed (e.g., count values are periodically increased, and decreased responsive to a match) this may be reversed and the address associated with the minimum count may be provided for refreshing while the address associated with the maximum count is replaced.

The RHR state control circuit 236 may receive the refresh signal AREF and provide the row hammer refresh signal RHR. The refresh signal AREF may be periodically generated and may be used to control the timing of refresh operations. The memory device may carry out a sequence of auto-refresh operations in order to periodically refresh the rows of the memory device. The RHR signal may be generated m order to indicate that the device should refresh a particular targeted row (e.g., a victim row) instead of an address from the sequence of auto-refresh addresses. The RHR state control circuit 236 may use internal logic to provide the RHR signal. In some embodiments, the RHR state control circuit 236 may provide the RHR signal based on certain number of activations of AREF (e.g., every $4^{th}$ activation of AREF). In some embodiments, the RHR state control circuit 236 may provide a number of activations of the signal RHR in a row based on a number of victim wordlines associated with an aggressor wordline. The RHR state control circuit 236 may also provide an internal refresh signal IREF, which may indicate that an auto-refresh operation should take place. In some embodiments, the signals RHR and IREF may be generated such that they are not active at the same time (e.g., are not both at a high logic level at the same time).

In some embodiments, the refresh control circuit 216 may perform multiple refresh operations responsive to each activation of the refresh signal AREF. For example, each time the refresh signal AREF is received, the refresh control circuit 216 may perform N different refresh operations, by providing N different refresh addresses RXADD. Each refresh operation may be referred to as a 'pump'. In some embodiments, the refresh control circuit 216 may have a fixed pattern where some pumps are assigned to auto-refresh operation and some pumps are assigned to targeted refresh operations. In some embodiments, the refresh control circuit 216 may dynamically determine whether a given pump is associated with an auto-refresh operation, a targeted refresh operation, or no refresh operation.

The refresh address generator 234 may receive the row hammer refresh signal RHR and the match address HitXADD. The match address HitXADD may represent an aggressor row. The refresh address generator 234 may determine the locations of one or more victim rows based on the match address HitXADD and provide them as the refresh address RXADD when the signal RHR indicates a targeted refresh operation. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples. For example, +/−3, +/−4, and/or other rows may also be refreshed.

The refresh address generator 234 may determine the value of the refresh address RXADD based on the row hammer refresh signal RHR. In some embodiments, when the signal RHR is not active, the refresh address generator 234 may provide one of a sequence of auto refresh addresses. When the signal RHR is active, the refresh address generator 234 may provide a targeted refresh address, such as a victim address, as the refresh address RXADD. In some embodiments, the refresh address generator 234 may count activations of the signal RHR, and may provide closer victim rows (e.g., HitXADD+/−1) more frequently than victim rows which are further away from the aggressor address (e.g., HitXADD+/−2).

The row decoder 208 may perform one or more operations on the memory array (not shown) based on the received signals and addresses. For example, responsive to the activation signal ACT and the row address XADD (and REF and RHR being at a low logic level), the row decoder 208 may direct one or more access operations (for example, a read operation) on the specified row address XADD. Responsive to the RHR signal being active, the row decoder 208 may refresh the refresh address RXADD.

Figure 3:
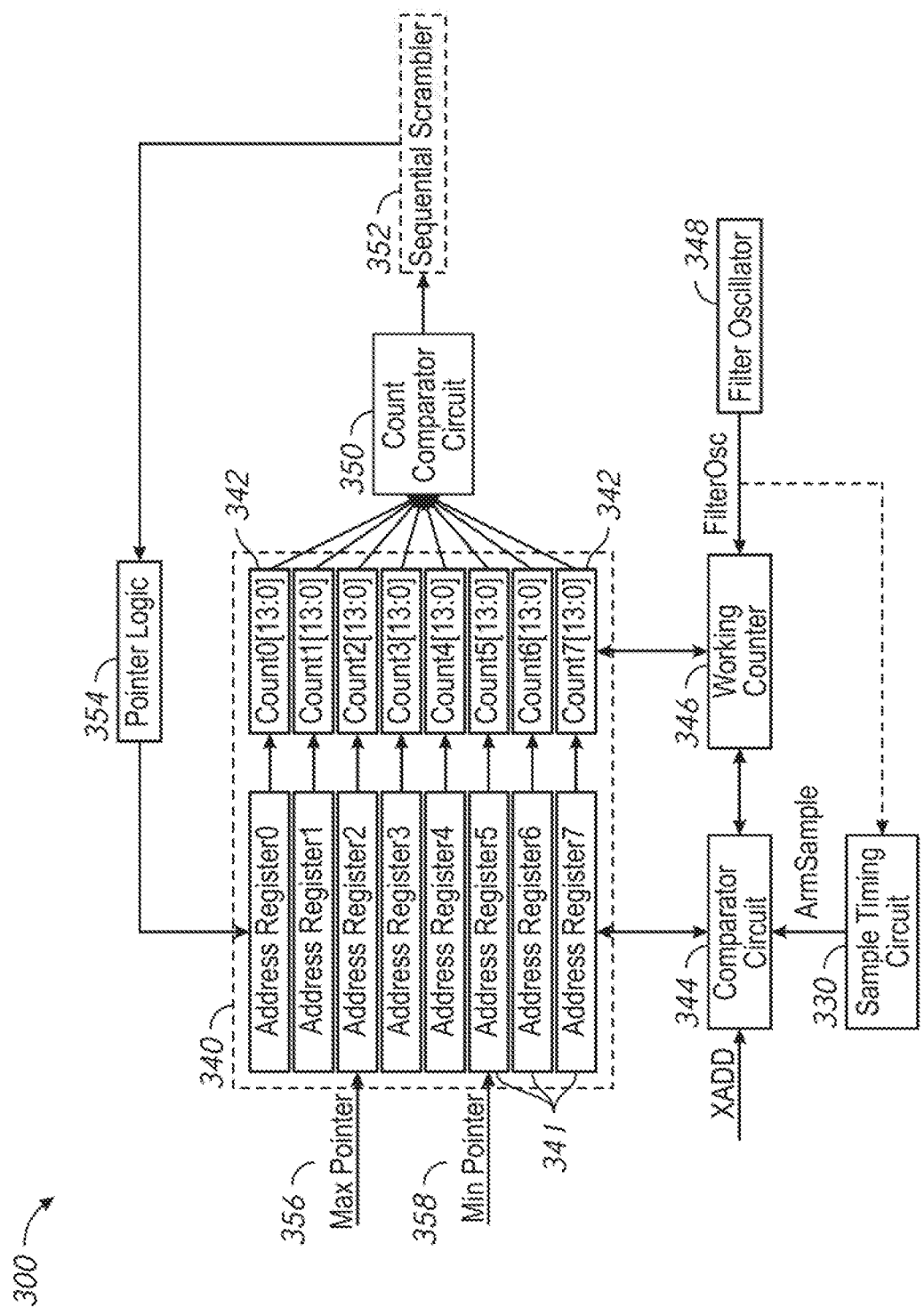
FIG. 3 is a block diagram of an aggressor detector circuit according to an embodiment of the present disclosure.

FIG. 3 is a block diagram of an aggressor detector circuit, according to an embodiment of the present disclosure. The aggressor detector circuit 300 may, in some embodiments, be used as the aggressor detector circuit 232 of FIG. 2. Also shown in FIG. 3 is a sample timing circuit 330, which is shown here as part of the aggressor detector circuit 300. As shown in the example embodiment of FIG. 2, in some embodiments the sample timing circuit may be a separate component, or as shown in the example embodiment of FIG. 3, may be part of the aggressor detector circuit. The sample timing circuit 330 may function in a similar manner to the sample timing circuit 230 described in FIG. 2. For the sake of brevity the operation of the sample timing circuit 330 will not be described in detail.

The aggressor detector circuit 300 includes a data storage unit 340 which stores a number of row addresses. In particular, the data storage unit 340 may include a number of registers 341, each of which may store a row address. For example, each register may include a number of memory cells, such as latch circuits, which may store a bit of data. Each register may include a number of memory cells based on the number of bits in a row address. In some embodiments, each register may include a same number of memory cells as the number of bits in a row address. For example, if the row address includes 17 bits, each register may include 17 memory cells. More or fewer bits for each row address may be used in other examples. In some embodiments, each register 341 may include one or more additional memory cells, which may be used to store additional information related to the register and/or row address stored therein.

The data storage unit 340 has a number of registers 341 to store a number of row addresses. The number of bits (e.g., latch circuits) in each register 341 may generally be referred to as a width of the data storage unit 340, while the number of registers 341 in the data storage unit 340 may generally be referred to as the depth of the data storage unit 340. In the embodiment of FIG. 3, eight registers 341 are shown, which in turn may store up to eight row addresses. Other numbers of registers 341, for example four or sixteen registers, may be used in other example embodiments.

Each of the registers 341 is associated with a count value 342. Each count value 342 may be a numerical value which represents a number of accesses to the row address stored in the associated one of the registers 341. In some embodiments, the count values 342 may be stored as a binary number. For example, each count value 342 may be a register (e.g., similar to the registers 341) with a number of latch circuits, each of which stores a bit of a binary number. The number of bits may determine a maximum value of the count values 342. For example, in some embodiments, each of the count values 342 may be a 14 bit number, and thus each count value may represent any number from 0 to 16,383. Other sizes of count value may be used in other embodiments. In some embodiments, the count values 342 may be part of the same data storage unit 340 as the registers 341. In some embodiments, each of the registers 341 may include the associated count value 342, and thus each register 341 may include a certain number of bits (e.g., latch circuits) to store the address, and a certain number of bits latch circuits) to store the count value 342.

When one or more of the count values 342 is updated, it may be read out to a working counter circuit 346. Based on one or more signals from the comparator circuit 344 and/or the filter oscillator circuit 348 as described herein, the working counter circuit 346 may retrieve a count value 342, update the value of that count value 342 and then write back the updated count value.

In some embodiments, rather than being stored as a binary number in a data storage unit 340, the count values 342 may be stored in other manners (e.g., in counter circuits) which may intrinsically update the stored count value 342. In some embodiments, certain components, such as the working counter circuit 346 may not be necessary, and may be omitted.

The aggressor detector circuit 300 receives the row address XADD along the row address bus. Responsive to an activation of the sampling signal ArmSample, a comparator circuit 344 compare the current value of the row address XADD to the addresses stored in the data storage unit 340. The comparator circuit 344 may determine if the received row address XADD is an exact match (e.g., the same sequence of bits) as any of the addresses stored in the data storage unit 340. In some embodiments, the received address XADD may be compared to all of the stored addresses sequentially. In some embodiments, the received address XADD may be compared to all of the stored addresses simultaneously.

In some embodiments, the registers 341 may include content addressable memory (CAM) cells as the latch circuits which store the bits of the row address (and/or count values 342). The CAM cells may be capable of determining if a provided bit matches the state of the bit stored in the CAM cell. The signals from each of the CAM cells in one of the registers 341 may be coupled together with AND logic. Accordingly, when a row address XADD is provided to the data storage unit 340, each of the registers 341 may provide a match signal with a state which indicates if the row address is a match or not. In the embodiment where CAM cells are used in the registers 341, the comparator circuit 344 may receive the match signals and identify matches based on the match signals.

If there is a match between the received address XADD and one of the stored addresses in the data storage unit 340, then the comparator circuit 344 may send a match signal to the working counter circuit 346. The working counter circuit 346 may update the count value associated with the register 341 which contains the stored row address which matches the received row address XADD. When a match is indicated, the working counter circuit 346 may update the count value 342 in a first direction. For example, responsive to a match, the count value may be increased, such as being incremented (e.g., increased by 1).

If there is not a match for any of the stored addresses, the received row address XADD may be stored in the data storage unit 340. The comparator circuit 344 may determine if any of the registers 341 are available (e.g., not currently storing a row address). For example, in some embodiments, each of the registers 341 may include additional bits (e.g., additional memory cells) which are used to store an empty flag. The empty flag may be in a first state to indicate that the register is available (e.g., empty) and a second state to indicate that the register is not available (e.g., storing a row address). Other methods of determining if the registers 341 are available or not may be used in other examples.

If at least one of the registers 341 is available, the comparator circuit 344 may store the row address XADD in one of the available registers. If none of the registers are available, then the row address XADD may be stored in the register indicated by the minimum pointer 358. When the row address XADD is stored in the register 341, it may overwrite any previous row address stored in the register 341. When a new address is stored in one of the registers 341 (e.g., either overwriting an old address or being stored in an available register) the count value 342 associated with that register may be reset to an initial value (e.g., 0 or 1). For example, the comparator circuit 344 may send a reset signal to the working counter circuit 346, which may update the indicated count value 342 to the initial value.

The working counter circuit 346 is also coupled to an oscillator signal FilterOsc from a filter oscillator circuit 348. The filter oscillator circuit 348 may be an oscillator circuit which provides periodic activations of the oscillator signal FilterOsc. Each time the working counter circuit 346 receives an activation of the filter oscillator signal FilterOsc, the working counter circuit 346 may update all, of the count values 342 in a second direction. For example, responsive to an activation of the oscillator signal FilterOsc, all of the count values 342 may be decreased, such as by decrementing them (e.g., decreasing by 1). In some embodiments, the count values 342 may have a minimum value (e.g., 0) and may not be decremented below the minimum value. For example, if a count value is at a minimum value of 0, and the filter oscillator circuit 348 provides an activation of the oscillator signal FilterOsc, the count value may remain at 0 instead of being further decremented.

In some embodiments, it may not be possible to simultaneously update a count value in both directions at the same time. To prevent this, in some optional embodiments, the oscillator signal FilterOsc may be provided to the sample timing circuit 330. When the oscillator signal FilterOsc is active, the sample timing circuit 330 may suppress any activations of the sampling signal ArmSample. Accordingly, the sample timing circuit 330 may be prevented from activating the signal ArmSample while the signal FilterOsc is active.

The rate of activations of the oscillator signal (e.g., the period frequency) may be determined based on a degree of filtering which is desired. The rate of the oscillator signal may be set such that only addresses which represent a certain percentage of the row addresses which are received (e.g., sampled). This relationship may generally be expressed by Equation 1, below:

$$\text{Filter Appearance Percentage} = 100\% * \frac{\text{rate of counter increases}}{\text{rate of counter decreases}} \quad \text{Eqn. 1}$$

Since the rate of counter increases (e.g., the rate at which any counter may be increased) is based on the rate at which addresses are received (e.g., sampled), and the rate of counter decreases is based on the rate that the filter oscillator produces the oscillator signal FilterOsc, Equation 1 can be rewritten as Equation 2, below:

$$\text{Filter Appearance Percentage} = 100\% * \frac{\text{ArmSample period}}{\text{FilterOsc period}} \quad \text{Eqn. 2}$$

In Equation 2, the ArmSample period may represent the average time between any activations of the sampling signal ArmSample. In embodiments where ArmSample is activated with some degree of randomness, the ArmSample period may represent the timing between pulses averaged over an infinite number of activations. The FilterOsc period represents the rate at which the filter oscillator circuit 348 provides the oscillator signal FilterOsc. In some embodiments, the ArmSample period may be known, and a desired filter appearance percentage may be chosen, and Eqn. 2 may be used to calculate a FilterOsc period. For example, the filter appearance percentage may be chosen to be 12.5%, and accordingly the FilterOsc period=ArmSample period/0.125. Other filter appearance percentages, for example 15% or 10%, may be used in other embodiments.

A count comparator circuit 350 may compare the count values 342 to each other. The count comparator circuit 350 may determine a maximum value of the count values 342 and a minimum value of the count values 342. In some embodiments, the count comparator circuit 350 may determine the maximum and minimum each time one or more of the count values 342 is updated. In some embodiments, the count comparator circuit 350 may determine the maximum and minimum of the count values 342 when an address needs to be stored and/or retrieved from the data storage unit 340.

The count comparator circuit 350 may indicate the maximum and minimum values to a pointer logic circuit 354. The pointer logic circuit 354 may direct the maximum pointer 356 to indicate the register associated with the maximum count value and may direct the minimum pointer 358 to indicate the register associated with the minimum count value. The address stored in the register 341 indicated by the maximum pointer 356 may be provided as the match address HitXADD. The address stored in the register 341 indicated by the minimum pointer 358 may be replaced by a new address when there are no available registers.

In some embodiments, an optional sequential scrambler 352 may be coupled between the count comparator circuit 350 and the pointer logic circuit 354. The sequential scrambler 352 may occasionally replace the register identified as the maximum by the count comparator circuit 350 with a register from a sequence of registers. Accordingly, the pointer logic circuit 354 may be directed to indicate a register 341 from the sequence of registers instead. For example, the sequential scrambler 352 may activate every other time a maximum value needs to be provided. Accordingly, the maximum pointer 356 may indicate a register associated with a maximum count value, a first register in the sequence, a register associated with a maximum count value, a second register in the sequence, etc.

FIGS. 4A-4D are timing diagrams depicting an example operation of an aggressor detector circuit according to an embodiment of the present disclosure. FIGS. 4A-4D show different points in the operation of an aggressor detector circuit, such as the aggressor detector circuit 232 of FIG. 2 and/or 300 of FIG. 3. For clarity, certain operations have been simplified for the timing diagrams 400a-d of FIGS. 4A-4D.

Since FIGS. 4A-4D are generally similar, for the sake of brevity, the features that the timing diagrams 400a-d share in common will be described once. Each of the traces of the timing diagram 400a-d are shown along a common x-axis, which represents time. Each trace (except for the row address XADD) has a separate y-axis which represents a logical level of that signal. The traces in the timing diagrams 400a-d show an idealized version of the signals with, for example, instantaneous transitions between low and high logical levels. Waveforms may be more messy (e.g., more noisy, non-zero transition times) in some embodiments.

The first trace of the timing diagrams 400a-d shows a clock signal CLK, which may be used to control the timing of access operations. The clock signal CLK may be a per signal, such as a square wave.

The second trace of the timing diagrams 400a-d shows the row address XADD. The value of the row address XADD may change responsive to a rising edge of the clock signal CLK. The values of the row address values are represented as row0, row1, row2, etc. Each value of the row address may be a string of binary bits.

The third trace of the timing diagrams 400a-d shows the sampling signal ArmSample. In the embodiments shown in FIGS. 4A-4D, the signal ArmSample is activated with periodic timing, at the same rate as the clock signal CLK, and accordingly every value of the row address XADD may be sampled (except for the value of the row address active at the same time as the signal FilterOsc). It should be understood that in other embodiments, ArmSample may be activated with less regular timing, and only certain values of the row address may be sampled. In the example embodiment of FIG. 4, the signal ArmSample may be suppressed when the signal FilterOsc is active.

The fourth trace of the timing diagrams 400a-d shows the filter oscillator signal FilterOsc. The signal FilterOsc may be a periodic signal which may activate with regular timing.

Figure 4A:
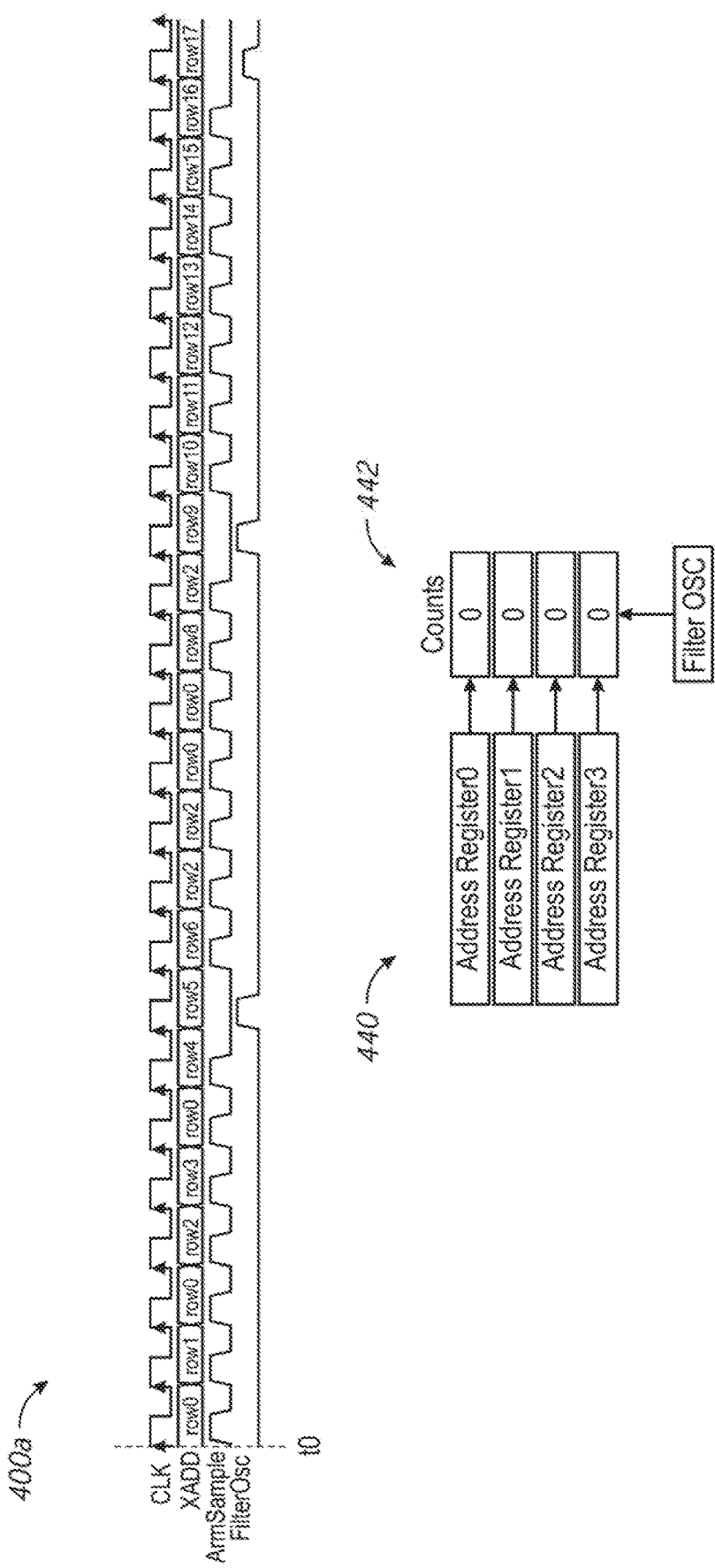
FIGS. 4A-4D are timing diagrams depicting an example operation of an aggressor detector circuit according to an embodiment of the present disclosure.
Figure 4B:
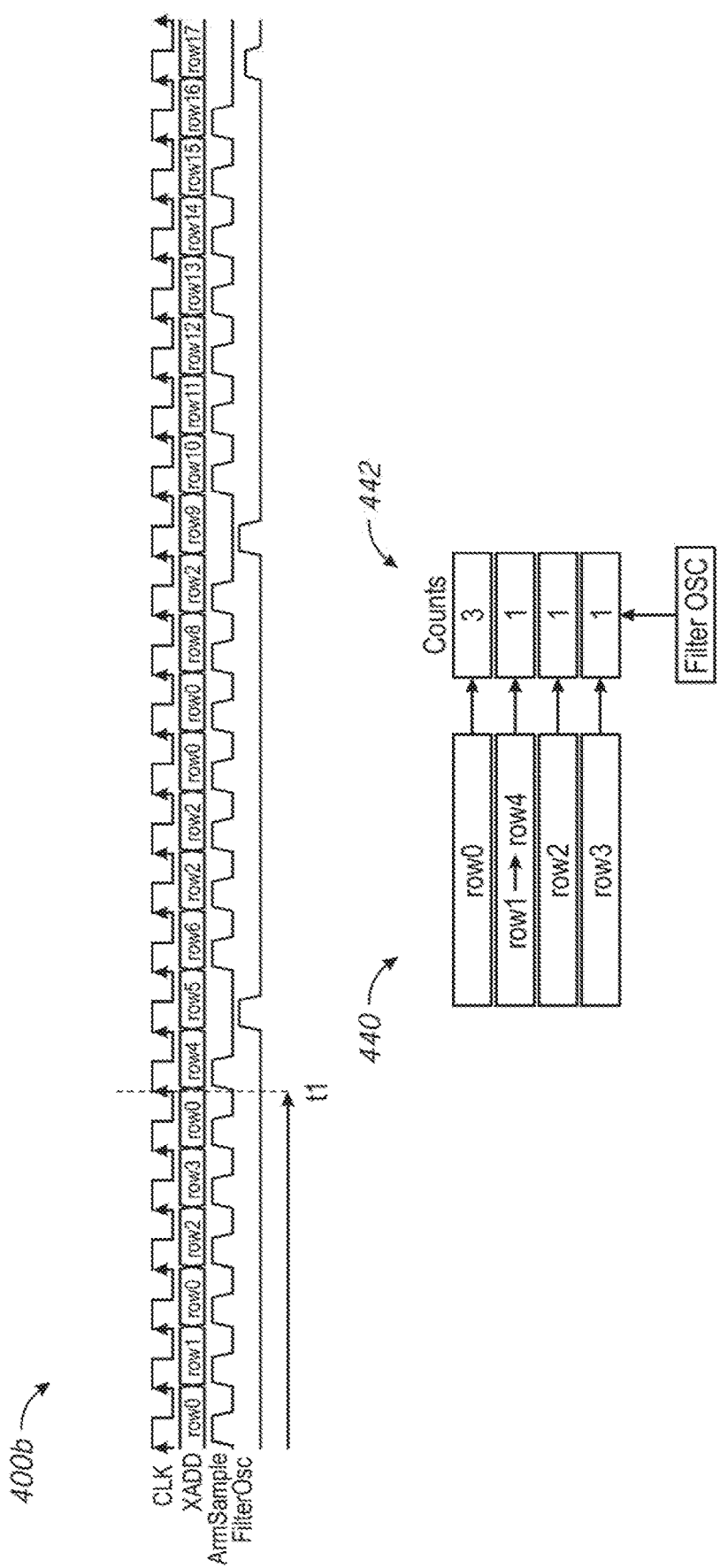

Each of the FIGS. 4A-4B shows a different time point t0 to t3 in the operation of an example aggressor detector circuit. Each of the FIGS. 4A-4B shows an example data storage unit with a set of registers 440 and their associated count values 442 at the time point t0-t3. In the example embodiments shown in FIGS. 4A-4D, there are four total registers 440 and count values 442. The registers 440 and count values 442 may function in a generally similar manner to the registers 341 and count values 342 of the data storage unit 340 of FIG. 3.

FIG. 4A shows an initial time t0. At the initial time t0, the aggressor detector circuit is in an initial state. Accordingly, all of the address registers 440 are empty (e.g., not storing an address) as indicated by their labeling as 'Address Register0' etc. Each of the associated count values is set to 0 as an initial value.

FIG. 4B shows the aggressor detector circuit at a first time t1 after the initial time t0. At the first time, several access operations have previously occurred. Since the signal ArmSample is activated for each row access operation, each of the row addresses shown in the second trace of the timing diagram 400b up to the time t1 are sampled. Accordingly, just before the time t1, the row address with the value row0 has been sampled 3 times, and row1, row2, and row3 have each been sampled once. Since there are four unique values of row address, and since there are four registers 440, each of the addresses has been stored in one of the registers. Since the address row0 was the first address which was sampled, it is stored in the first register 440 Address Register0, the second sampled address row1 is stored in Address Register1, etc.

When a new address is sample and stored in one, of the registers 440, the count value 442 associated with that register 440 may be updated from 0 to 1 (e.g., incremented). Each time the address stored in that register 440 is subsequently sampled, the count value 442 associated with that register is incremented again. Accordingly, just before the time t1, the count value 442 associated with the register 440 storing the address row0 is 3, and the other count values are 1.

At the first time t1, a new row address value, row4 is sampled. The row address row4 is compared to the three row addresses (row0-row3) in the registers 440 (e.g., by the comparator circuit 344 of FIG. 3). Since the row address row4 is not currently stored in one of the registers 440, it may be stored in one of the registers 440. Since all of the registers are full (e.g., each storing a row address), the register associated with the lowest count value may be used. In the example of the timing diagram 400b of FIG. 4B, three of the registers are tied (e.g., the ones with count values of 1). In this case, the tie is broken by selecting the tied register with the lowest index (e.g., Address Register1), this is indicated by the arrow showing that the address in Address Register1 is changed from row1 to row4. Since the address in the register 440 is changed (e.g., from row1 to row4) the associated count value 442 may be reset to 1. In this case, since the count value associated with that register was already a 1, the count value may remain at 1.

Figure 4C:
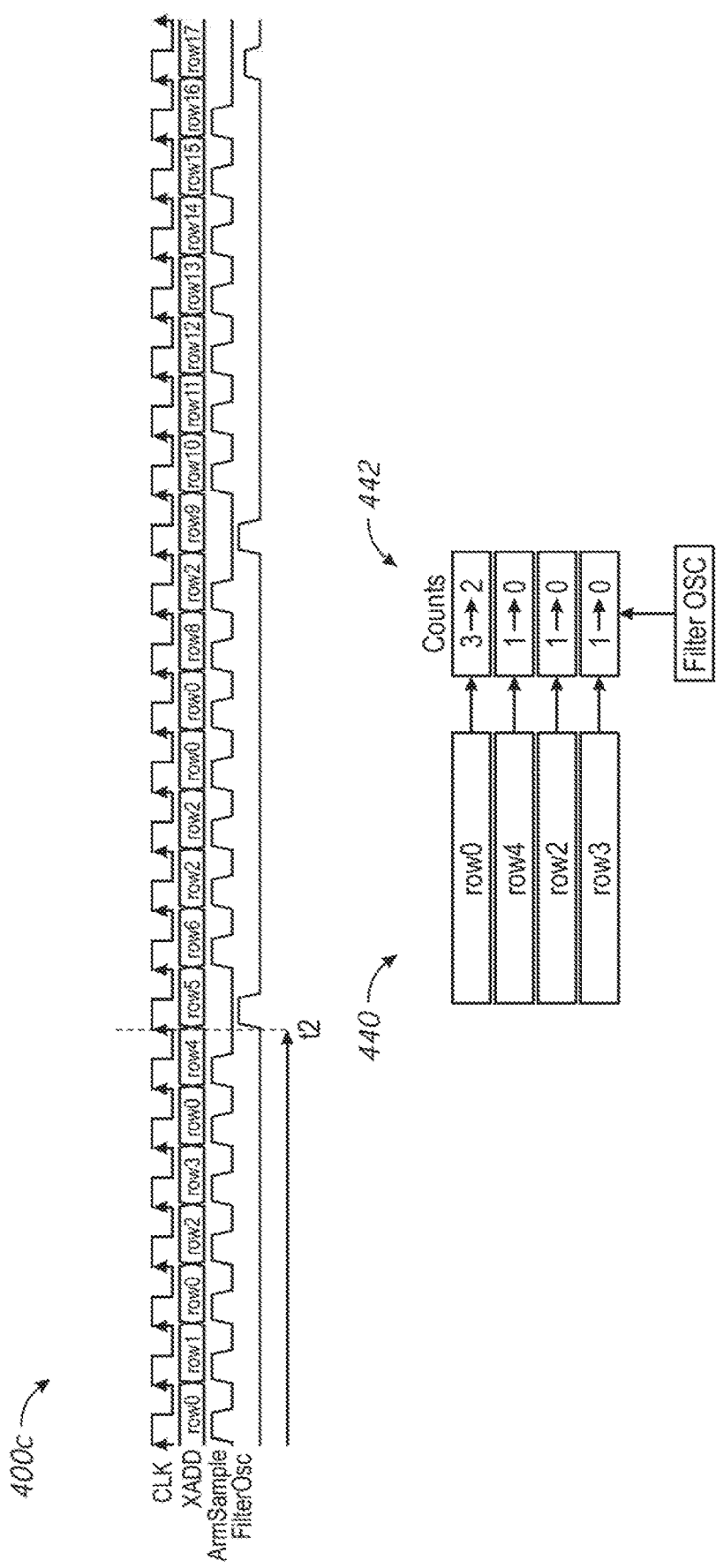

FIG. 4C shows the state of the aggressor detector circuit at a time t2 which is after the first time t1. At the time t2, there is an activation of the oscillator signal FilterOsc (e.g., as provided by the oscillator circuit 348 of FIG. 3). At the time t2, there is also an access to a new row address (row5), however the activation of the oscillator signal causes the sampling signal ArmSample to be suppressed. Accordingly, the value row5 is not sampled and is not stored in the registers 440. Instead, responsive to the activation of the oscillator signal, all of the count values 442 may be updated, in this case by decreasing, them all by 1 (e.g., decrementing them). As shown by the arrows in the count values 442, the count of accesses for row0 may be reduced from 3 to 2, and the counts for row4, row2, and row3 may be reduced from 1 to 0.

Figure 4D:
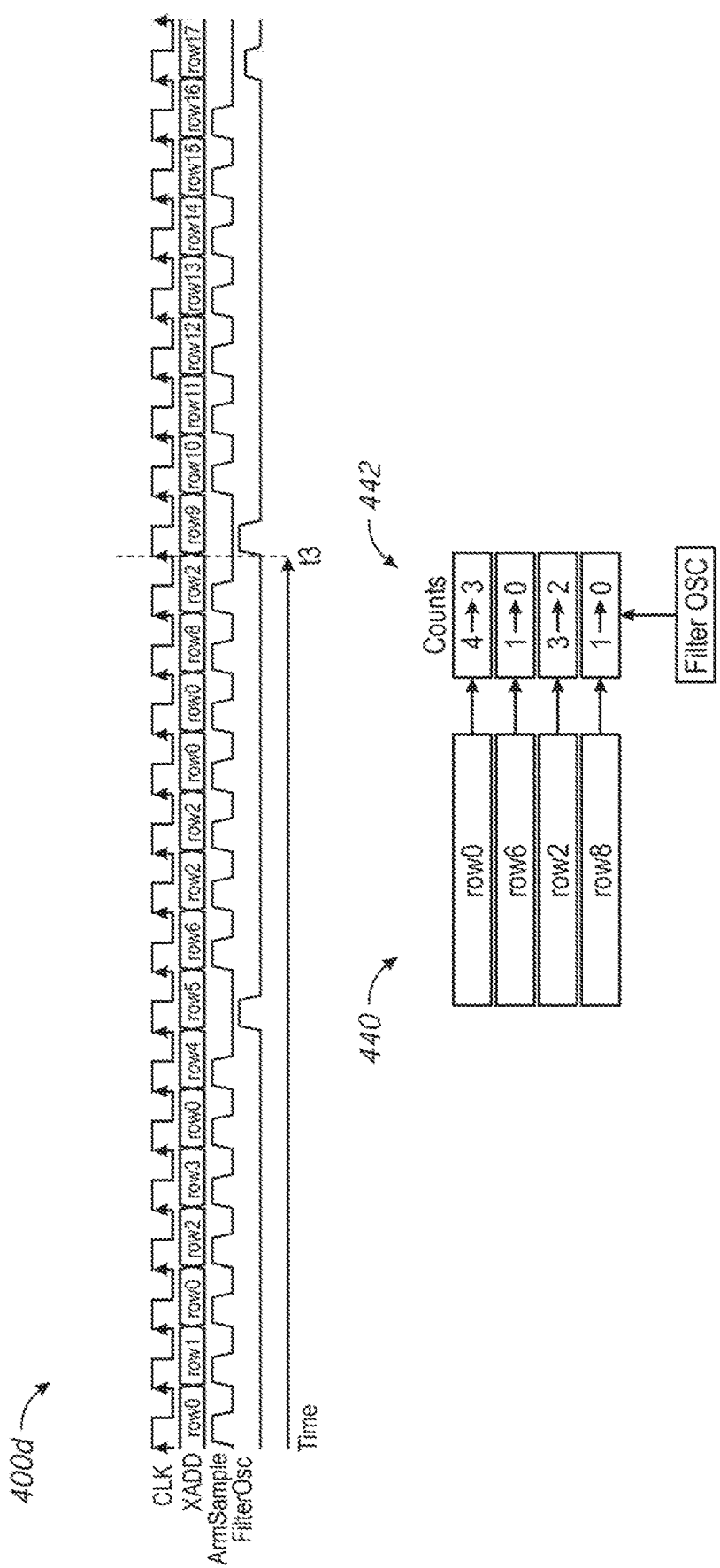

FIG. 4D shows the state of the aggressor detector circuit at a time t3 which is after the second time t2. The time t3 represents a next activation of the oscillator signal FilterOsc after the activation at the second time t2. Between the times t2 and t3, there are several row access operations which adjust the addresses stored in the registers 440 and their count values 442. In brief, row6 replaces row4, and the count value associated with row 6 is set to 1. The address row2 is sampled twice in a row, which raises the count of row2 to 2. Then the address row0 is sampled twice in a row, which raises the count values associated with row0 to 4. The address row8 is accessed which replaces row3 in the registers 440 and causes the associated count value to be set to 1, and then row2 is sampled which raises the count value associated with row2 to 3.

At the time t3, there is another activation of the oscillator signal FilterOsc. Accordingly, all of the count values 442 may be decremented. The count associated with row0 may be reduced from 4 to 3, the count associated with row2 may be reduced from 3 to 2, and the counts associated with row6 and row8 may each be reduced from 1 to 0.

As may be seen from the example operation of FIGS. 4A-4D, the most frequently accessed rows (e.g., row0 and row2) have count values which continue to accumulate, while rows which are less frequently accessed may be decremented (e.g., due to the signal FilterOsc) faster than they accumulate. Accordingly, less frequently accessed rows may have the minimum count value and may be replaced when new addresses are stored. This may function to filter one these rows from being stored in the data storage unit 440.

Figure 5:
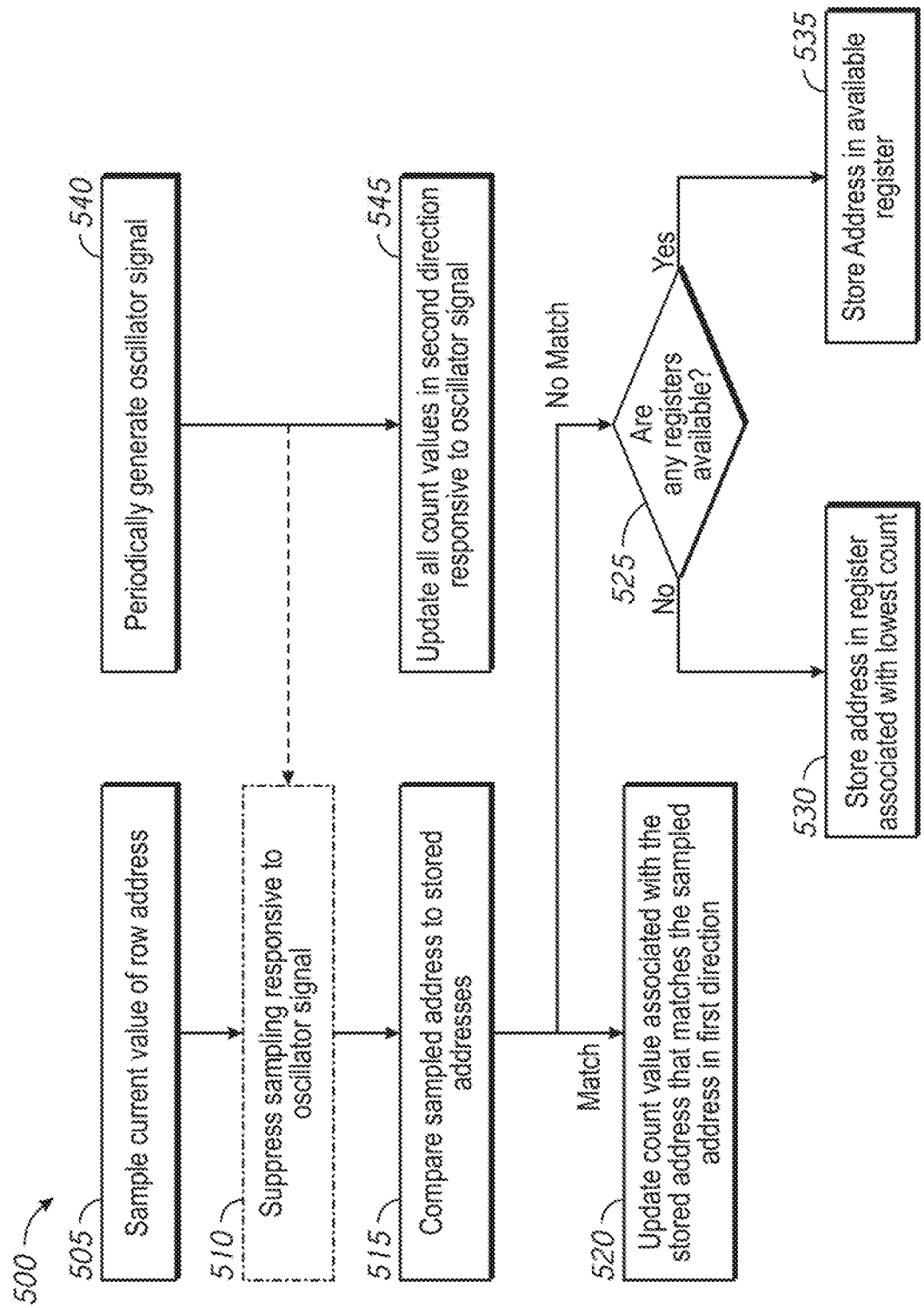
FIG. 5 is a flow chart of a method of lossy row access counting according to an embodiment of the present disclosure.

FIG. 5 is a flow chart of a method of lossy row access counting according to an embodiment of the present disclosure. The method 500 may, in some embodiments, be implemented by one or more of the components and/or signals depicted in FIGS. 1-4D.

The method 500 may include block 505, which describes sampling a current value of a row address. Row addresses may be provided along a row address bus as part of various access operations. The current value of the row address may be sampled based on activations of a sampling signal (e.g., the sampling signal ArmSample provided by the sample timing circuit 230 of FIG. 2 and/or 330 of FIG. 3). In some embodiments, the sampling may be performed with periodic timing and/or random timing. Block 505 may generally be followed by optional block 510 or by block 515. Before describing optional block 510, block 540 will be described.

The method 500 may also include block 540, which describes periodically generating an oscillator signal. In some embodiments, the oscillator signal (e.g., FilterOsc) may be provided by an oscillator circuit (e.g., 348 of FIG. 3). The oscillator signal may be provided with a period/frequency which is based on a rate at which the row address is sampled (e.g as described in Equations 1 and 2). In some embodiments, while the period of the sampling signal and the filter oscillator signal may be related, these two signals may generally be provided with timing which is independent of each other. Accordingly, blocks 505 and 540 describe processes which happen in parallel to each other.

Block 540 may generally be followed by block 545, which describes updating all count values in a second direction responsive to an activation of the oscillator signal. For example responsive to each activation of the oscillator signal all of the count values may be decreased (e.g., decremented).

Returning to block 505, in some embodiments block 505 may generally be followed by optional block 510 which describes suppressing the sampling responsive to activations of the oscillator signal. In some embodiments where block 510 is used, when the oscillator signal is active, the sampling signal may be prevented from being active. In some embodiments where block 510 is used, the sampling signal may be still be active, but it may be ignored when the oscillator signal is at a high level. In general, in embodiments where block 510 is used, sampling the address (and comparing the sampled address) may not be performed while the oscillator signal is active.

When the oscillator signal is not active (e.g., when sampling is not being suppressed) block 505 may generally be followed by block 515, which describes comparing the sampled address to stored addresses. The addresses may be stored in a data storage unit, such as a register stack (e.g. data storage unit 340 of FIG. 3). Block 515 may involve determining if any of the stored addresses are an exact match for any of the stored addresses. If there is an exact match, block 515 may generally be followed by block 520. If there is not an exact match, block 515 may generally be followed by block 525.

Block 520 describes updating the count value associated with the stored address that matches the sampled address. The count value may be updated in a first direction (e.g., increased). The first direction may be opposite the second direction (e.g., the direction the counts are updated in response to the oscillator signal as described in block 545). In some embodiments, in block 520 the count value associated with the matched address may be incremented.

Block 525 describes determining if any registers in the data storage unit are available. This may involve determining if there is at least one register which does not contain an address, or which contains an address which has already been refreshed. For example, in some embodiments each of the registers may be associated with an empty flag, which may indicate if the register is available or not. If there is not at least one available register, block 525 may generally be followed by block 530. If there is at least one available register, block 525 may generally be followed by block 535.

Block 530 describes storing the sampled address in a register associated with the lowest count value. The current address stored in the register may be overwritten by the sampled address. In some embodiments when the address is overwritten, the count value may be reset to an initial value (e.g., 1). In some embodiments, where there is more than one minimum count value (e.g., a tie) then some selection criteria (e.g., based on register index, at random, etc.) may be used to break the tie.

Block 535 describes storing the sampled address in an available register of the data storage unit. When the sampled address is stored in the available register, the register may be marked at not-available (e.g., by changing a state of an empty flag). When the sampled address is stored, the count value associated with the register where the address is stored may be set to an initial value (e.g., 1).

Although not shown in FIG. 5, responsive to a targeted refresh operation, the method 500 may further include providing an address associated with a maximum count value. When the address provided with the maximum count value is provided, one or more wordlines based on the provided, address (e.g, one or more victim wordlines) may be refreshed. In some embodiments after the address is provided, the count value may be reset to an initial value (e.g, 0 or 1) and the register containing that address may be marked as available (e.g., by removing, the address from the register and/or by changing a state of an empty flag).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a plurality of registers each configured to store a stored row address, wherein each of the plurality of registers is associated with one of a plurality of count values;
a comparator circuit configured to receive a received row address and compare it to the stored row addresses in the plurality of registers, wherein the count value associated with one of the plurality of registers is updated by a fixed amount in a first direction responsive to the received row address matching the stored row address in the one of the plurality of registers, wherein the comparator circuit is configured to store the received row address in one of the plurality of registers responsive to received row address not matching one of the stored row addresses, wherein the comparator circuit is configured to determine if any of the plurality of re inters are available, wherein the received row address is stored in an available register of the plurality of registers if there is at least one available register, and wherein the received row address is stored in one of the plurality of registers associated with a lowest of the plurality of count values responsive to none of the plurality of registers are available; and
an oscillator configured to periodically activate an oscillator signal, wherein responsive to each activation of the oscillator signal, all of the plurality of count values are updated by the fixed amount in a second direction opposite the first direction.

2. The apparatus of claim 1, wherein the comparator circuit is configured to increment the count value responsive to the received row address matching the stored row address, and wherein the responsive to each activation of the oscillator signal, all of the plurality of count values are decremented.

3. The apparatus of claim 1, further comprising a sample timing circuit configured to provide activations of a sampling signal, wherein the comparator circuit is configured to compare a current row address to the stored row addresses responsive to each activation of the sampling signal.

4. The apparatus of claim 3, wherein a period of the oscillator signal is based on an average period of the sampling signal.

5. An apparatus comprising:
a plurality of registers each configured to store a stored row address, wherein each of the plurality of registers is associated with one of a plurality of count values;
a comparator circuit configured to receive a received row address and compare it to the stored row addresses in the plurality of registers, wherein the count value associated with one of the plurality of registers is updated b a fixed amount in a first direction responsive to the received row address matching the stored row address in the one of the plurality of registers;

an oscillator configured to periodically activate an oscillator signal, wherein responsive to each activation of the oscillator signal, all of the plurality of count values are updated by the fixed amount in a second direction opposite the first direction; and a sample timing circuit configured to provide activations of a sampling signal, wherein the comparator circuit is configured to compare a current row address to the stored row addresses responsive to each activation of the sampling signal, wherein the sampling signal is suppressed when an activation of the oscillator signal is being provided.

6. The apparatus of claim 1, wherein the plurality of registers each comprise a first plurality of bits configured to store the row address and a second plurality of bits configured to store the associated one of the plurality of count values.

7. An apparatus comprising:
a memory array comprising a plurality of wordlines each associated with a row address;
an aggressor detector circuit configured to store a plurality of stored addresses each of which is associated with a count value, wherein the count value is incremented responsive to a received row address matching the stored address associated with the count value, wherein each of the count values is periodically decremented, and wherein the aggressor detector circuit is configured to provide one of the plurality of stored addresses as a match address based, in part, on the count values;
a row decoder configured to refresh at least one wordline based on the match address
a sample timing circuit configured to provide a sampling signal, wherein the aggressor detector circuit is configured to receive a row address with timing based on the sampling signal, wherein the sampling signal is suppressed while the count values are being periodically decremented.

8. The apparatus of claim 7, wherein the aggressor detector circuit comprises an oscillator configured to provide an oscillator signal, and wherein the aggressor detector circuit is configured to decrement the count values at a rate based on the oscillator signal.

9. The apparatus of claim 8, wherein a period of the oscillator signal is based on a period that the row addresses are received by the aggressor detector circuit.

10. The apparatus of claim 7, further comprising a refresh address generator configured to provide at least one refresh address based on the match address, wherein the row decoder is configured to refresh the at least one wordline based on the at least one refresh address.

11. The apparatus of claim 10, wherein the count values have a minimum value and wherein the count values are configured to remain at the minimum value if they are decremented while they are at the minimum value.

12. A method comprising:
sampling a current row address along a row address bus;
comparing the sampled row address to a plurality of stored row addresses in a data storage unit;
updating; by a fixed amount in a first direction, one of a plurality of count values associated with one of the plurality of stored row addresses which matches the sampled row address;
periodically updating, by the fixed amount in a second direction, the plurality of count values;
providing activations of a sampling signal and performing the sampling the current row address responsive to each activation of the sampling signal, wherein a period of the oscillator signal is based, in part, on an average period of the sampling signal; and
suppressing the sampling responsive to the activations of the oscillator signal.

13. The method of claim 12, further comprising providing activations of a sampling signal and performing the sampling the current row address responsive to each activation of the sampling signal, wherein a period of the oscillator signal is based, in part, on an average period of the sampling signal.

14. The method of claim 12, further comprising storing the sampled row address in the data storage unit responsive to the sampled row address not matching one of the plurality of stored row addresses.

15. The method of claim 12, wherein the first direction comprises increasing the count value and wherein the second direction comprises decreasing the count value.

16. The apparatus of claim 8, wherein the sampling signal is suppressed responsive to an activation of the oscillator signal.

* * * * *